United States Patent
Rendall et al.

(10) Patent No.: US 12,249,498 B2
(45) Date of Patent: Mar. 11, 2025

(54) SPUTTER DEPOSITION

(71) Applicant: Dyson Technology Limited, Wiltshire (GB)

(72) Inventors: Michael Edward Rendall, Newbury (GB); Robert Ian Joseph Gruar, Swindon (GB)

(73) Assignee: Dyson Technology Limited, Malmesbury (GB)

( * ) Notice: Subject to any disclaimer, the term of this patent is extended or adjusted under 35 U.S.C. 154(b) by 26 days.

(21) Appl. No.: 17/776,721

(22) PCT Filed: Nov. 10, 2020

(86) PCT No.: PCT/GB2020/052842
§ 371 (c)(1),
(2) Date: May 13, 2022

(87) PCT Pub. No.: WO2021/094725
PCT Pub. Date: May 20, 2021

(65) Prior Publication Data
US 2022/0384159 A1 Dec. 1, 2022

(30) Foreign Application Priority Data
Nov. 15, 2019 (GB) .................... 1916627

(51) Int. Cl.
*H01J 37/34* (2006.01)
*C23C 14/35* (2006.01)
(Continued)

(52) U.S. Cl.
CPC .......... *H01J 37/3488* (2013.01); *C23C 14/35* (2013.01); *C23C 14/50* (2013.01);
(Continued)

(58) Field of Classification Search
CPC ............... H01J 37/3435; H01J 37/3488; H01J 37/32743; H01J 37/32889; C23C 14/34;
(Continued)

(56) References Cited

U.S. PATENT DOCUMENTS 3,829,373 A   8/1974 Kuehnle
4,014,779 A *   3/1977 Kuehnle ............... C23C 14/562
204/192.12

(Continued)

FOREIGN PATENT DOCUMENTS

CN    101457343 A   6/2009
CN    101527362 A   9/2009
(Continued)

OTHER PUBLICATIONS

Machine Translation WO 2015053392 (Year: 2015).*
(Continued)

*Primary Examiner* — Michael A Band
(74) *Attorney, Agent, or Firm* — Tucker Ellis LLP

(57) ABSTRACT

A sputter deposition apparatus including: a substrate support assembly arranged to support a substrate; a target support assembly arranged to support at least one sputter target for use in a sputter deposition of a target material onto the substrate; a plasma generation arrangement arranged to provide plasma for said sputter deposition; and a cartridge arranged to contain the substrate with deposited target material after said sputter deposition. The cartridge is removable from the sputter deposition apparatus.

10 Claims, 7 Drawing Sheets

(51) Int. Cl.
   *C23C 14/50* (2006.01)
   *C23C 14/56* (2006.01)
   *H01J 37/32* (2006.01)
   *C23C 14/34* (2006.01)

(52) U.S. Cl.
   CPC ...... *C23C 14/562* (2013.01); *H01J 37/32743* (2013.01); *H01J 37/32788* (2013.01); *H01J 37/3435* (2013.01); *C23C 14/34* (2013.01)

(58) Field of Classification Search
   CPC ......... C23C 14/35; C23C 14/50; C23C 14/56; C23C 14/562
   See application file for complete search history.

(56) References Cited

U.S. PATENT DOCUMENTS

| | | | |
|---|---|---|---|
| 4,026,787 | A | 5/1977 | Kuehnle |
| 4,278,528 | A | 7/1981 | Kuehnle et al. |
| 4,492,620 | A | 1/1985 | Matsuo et al. |
| 4,849,087 | A | 7/1989 | Meyer |
| 4,990,229 | A | 2/1991 | Campbell et al. |
| 5,091,049 | A | 2/1992 | Campbell et al. |
| 5,122,251 | A | 6/1992 | Campbell et al. |
| 5,215,638 | A | 6/1993 | Hausler |
| 6,103,070 | A | 8/2000 | Hong |
| 6,632,563 | B1 | 10/2003 | Krasnov et al. |
| 2001/0033952 | A1 | 10/2001 | Jenson et al. |
| 2002/0144656 | A1 | 10/2002 | Yoshikawa et al. |
| 2002/0175069 | A1 | 11/2002 | Domoto et al. |
| 2004/0048157 | A1 | 3/2004 | Neudecker et al. |
| 2004/0118678 | A1 | 6/2004 | Hartig |
| 2006/0134522 | A1 | 6/2006 | Zhang et al. |
| 2006/0196766 | A1 | 9/2006 | Chen |
| 2007/0125638 | A1 | 6/2007 | Zhang et al. |
| 2007/0166612 | A1 | 7/2007 | Krasnov et al. |
| 2007/0181421 | A1 | 8/2007 | Wei et al. |
| 2008/0023146 | A1 | 1/2008 | Shabalin |
| 2008/0035471 | A1 | 2/2008 | Mikami et al. |
| 2009/0032191 | A1 | 2/2009 | Chistyakov |
| 2009/0057136 | A1 | 3/2009 | Wang et al. |
| 2009/0159429 | A1 | 6/2009 | Tsukamoto |
| 2009/0159433 | A1 | 6/2009 | Neudecker et al. |
| 2009/0159441 | A1 | 6/2009 | Marunaka et al. |
| 2009/0277778 | A1 | 11/2009 | Stowell et al. |
| 2009/0288943 | A1 | 11/2009 | Kwak et al. |
| 2011/0117433 | A1 | 5/2011 | Sabi et al. |
| 2011/0226617 | A1 | 9/2011 | Hofmann et al. |
| 2011/0266141 | A1 | 11/2011 | Drayton et al. |
| 2012/0275008 | A1 | 11/2012 | Pradhan et al. |
| 2013/0112546 | A1 | 5/2013 | Brown et al. |
| 2014/0183036 | A1 | 7/2014 | Shao et al. |
| 2015/0016265 | A1 | 1/2015 | Ahmadi |
| 2016/0233541 | A1 | 8/2016 | Anapolsky et al. |
| 2017/0207071 | A1 | 7/2017 | De Bosscher et al. |
| 2018/0245217 | A1 | 8/2018 | Guo |
| 2019/0153589 | A1 | 5/2019 | Puls et al. |
| 2020/0095672 | A1 | 3/2020 | Honma et al. |
| 2021/0371297 | A1 | 12/2021 | Perkins et al. |
| 2022/0277940 | A1 | 9/2022 | Rendall |
| 2022/0380885 | A1 | 12/2022 | Rendall et al. |
| 2022/0380903 | A1 | 12/2022 | Rendall et al. |
| 2022/0389586 | A1 | 12/2022 | Rendall et al. |
| 2022/0393142 | A1 | 12/2022 | Gruar |
| 2022/0396865 | A1 | 12/2022 | Rendall et al. |
| 2022/0396869 | A1 | 12/2022 | Rendall |
| 2022/0403499 | A1 | 12/2022 | Rendall et al. |
| 2022/0407043 | A1 | 12/2022 | Rendall et al. |
| 2022/0411913 | A1 | 12/2022 | Gruar |
| 2023/0220539 | A1 | 7/2023 | Rendall et al. |

FOREIGN PATENT DOCUMENTS

| | | | |
|---|---|---|---|
| CN | 101903560 | A | 12/2010 |
| CN | 101970709 | A | 2/2011 |
| CN | 102037586 | A | 4/2011 |
| CN | 105874641 | A | 8/2016 |
| CN | 105951053 | A | 9/2016 |
| CN | 205803586 | U | 12/2016 |
| CN | 106684325 | A | 5/2017 |
| CN | 108281618 | A | 7/2018 |
| CN | 109075006 | A | 12/2018 |
| CN | 109402562 | A | 3/2019 |
| CN | 109415804 | A | 3/2019 |
| CN | 109477203 | A | 3/2019 |
| DE | 4126236 | A1 | 2/1993 |
| DE | 4418906 | A1 | 12/1995 |
| EP | 0103461 | A2 | 3/1984 |
| EP | 0403418 | A2 | 12/1990 |
| EP | 0837490 | A2 | 4/1998 |
| EP | 1729330 | A1 | 12/2006 |
| EP | 2527487 | A1 | 11/2012 |
| EP | 3396751 | A1 | 10/2018 |
| EP | 3399539 | A1 | 11/2018 |
| GB | 2360530 | A | 9/2001 |
| GB | 2572610 | A | 10/2019 |
| JP | 49-101273 | A | 9/1974 |
| JP | 61-009575 | A | 1/1986 |
| JP | 61-093542 | A | 5/1986 |
| JP | 03-068773 | A | 3/1991 |
| JP | H05-171433 | A | 7/1993 |
| JP | 10-150210 | A | 6/1998 |
| JP | H10-510676 | A | 10/1998 |
| JP | 11-269643 | A | 10/1999 |
| JP | 2002-235171 | A | 8/2002 |
| JP | 2003-007291 | A | 1/2003 |
| JP | 2004-043934 | A | 2/2004 |
| JP | 2006-257546 | A | 9/2006 |
| JP | 2007-005219 | A | 1/2007 |
| JP | 2007-067183 | A | 3/2007 |
| JP | 2008-045213 | A | 2/2008 |
| JP | 2008-138229 | A | 6/2008 |
| JP | 2011-032550 | A | 2/2011 |
| JP | 2011-108532 | A | 6/2011 |
| JP | 2011-521433 | A | 7/2011 |
| JP | 2011-225932 | A | 11/2011 |
| JP | 2013-028824 | A | 2/2013 |
| JP | 2013-164971 | A | 8/2013 |
| JP | 2015232158 | A | 12/2015 |
| JP | 2017-186581 | A | 10/2017 |
| JP | 6215329 | B2 | 10/2017 |
| JP | 2019-104956 | A | 6/2019 |
| KR | 10-2006-0124978 | A | 12/2006 |
| KR | 100762698 | B1 | 10/2007 |
| KR | 10-2008-0000736 | A | 1/2008 |
| KR | 10-2011-0092965 | A | 8/2011 |
| KR | 10-2015-0005262 | A | 1/2015 |
| KR | 101990881 | B1 | 6/2019 |
| WO | 89/07664 | A1 | 8/1989 |
| WO | 02/21627 | A2 | 3/2002 |
| WO | 2004/017356 | A2 | 2/2004 |
| WO | 2009/143254 | A2 | 11/2009 |
| WO | 2010/023878 | A1 | 3/2010 |
| WO | 2010/144761 | A2 | 12/2010 |
| WO | 2011/131921 | A1 | 10/2011 |
| WO | 2014/156129 | A1 | 10/2014 |
| WO | WO-2015053392 | A1 * | 4/2015 | ......... C23C 14/3407 |
| WO | 2016/078693 | A1 | 5/2016 |
| WO | 2018/001523 | A1 | 1/2018 |
| WO | 2018/128009 | A1 | 7/2018 |
| WO | 2018/202656 | A1 | 11/2018 |
| WO | 2018/225822 | A1 | 12/2018 |
| WO | 2019/181095 | A1 | 9/2019 |
| WO | 2021/094721 | A1 | 5/2021 |
| WO | 2021/094772 | A1 | 5/2021 |

OTHER PUBLICATIONS

International Search Report and Written Opinion received for PCT Patent Application No. PCT/GB2020/052838, mailed on Feb. 18, 2021, 9 pages.

(56) References Cited

OTHER PUBLICATIONS

International Search Report and Written Opinion received for PCT Patent Application No. PCT/GB2020/052893, mailed on Feb. 22, 2021, 11 pages.
International Search Report and Written Opinion received for PCT Patent Application No. PCT/GB2020/052896, mailed on Feb. 22, 2021, 10 pages.
Ribeiro, J. F., et al. "Lithium cobalt oxide crystallization on flexible polyimide substrate." Journal of Materials Science: Materials in Electronics 27 (2016): 631-636.
Office Action received for Japanese Patent Application No. 2022-528195, mailed on Oct. 17, 2023, 10 pages (6 pages of English Translation and 4 pages of Original Document).
Akazawa, "Highly adhesive Pt-electrode films directly deposited on SiO2 by electron-cyclotron-resonance plasma sputtering", Surface & Coatings Technology, vol. 204, 2010, pp. 1836-1841.
Combined Search and Examination Report Received for GB Application No. 1916628.9, mailed on May 5, 2020, 6 pages.
Combined Search and Examination Report Received for GB Application No. 1916632.1, mailed on May 5, 2020, 3 pages.
Combined Search and Examination Report Received for GB Application No. 1916633.9, mailed on May 4, 2020, 3 pages.
Combined Search and Examination Report Received for GB Application No. 1916634.7, mailed on May 15, 2020, 3 pages.
Combined Search and Examination Report Received for GB Application No. 1916635.4, mailed on May 5, 2020, 4 pages.
GB Search Report received for Application No. 1916619.8, mailed on May 7, 2020, 1 page.
GB Search Report received for Application No. 1916622.2, mailed on Mar. 30, 2020, 1 page.
GB Search Report received for Application No. 1916624.8, mailed on Apr. 29, 2020, 1 Page.
GB Search Report Received for GB Application No. 1916626.3, mailed on May 12, 2020, 1 page.
GB Search Report Received for GB Application No. 1916629.7, mailed on May 15, 2020, 1 page.
GB Search Report received for Patent Application No. 1916627.1, mailed on May 12, 2020, 1 page.
GB Search Report received for Patent Application No. 1916637.0, mailed on Mar. 30, 2020, 1 Page.
Hayashi et al., "Preparation of positive LiCoO2 films by electron cyclotron resonance (ECR) plasma sputtering method and its application to all-solid-state thin-film lithium batteries", Journal of Power Sources vol. 174, 2007, pp. 990-995.
International Search Report and Written Opinion received for PCT Patent Application No. PCT/GB20/052837, mailed on Feb. 12, 2021, 11 pages.
International Search Report and Written Opinion received for PCT Patent Application No. PCT/GB2020/052839, mailed on Feb. 23, 2021, 11 pages.
International Search Report and Written Opinion received for PCT Patent Application No. PCT/GB2020/052840, mailed on Feb. 25, 2021, 11 pages.
International Search Report and Written Opinion received for PCT Patent Application No. PCT/GB2020/052841, mailed on Mar. 1, 2021, 13 pages.
International Search Report and Written Opinion received for PCT Patent Application No. PCT/GB2020/052842, mailed on Feb. 25, 2021, 11 pages.
International Search Report and Written Opinion received for PCT Patent Application No. PCT/GB2020/052843, mailed on Feb. 26, 2021, 13 pages.
International Search Report and Written Opinion received for PCT Patent Application No. PCT/GB2020/052844, mailed on Feb. 18, 2021, 12 pages.
International Search Report and Written Opinion received for PCT Patent Application No. PCT/GB2020/052848, mailed on Dec. 23, 2020, 10 pages.
International Search Report and Written Opinion received for PCT Patent Application No. PCT/GB2020/052892, mailed on Feb. 25, 2021, 12 pages.
International Search Report and Written Opinion received for PCT Patent Application No. PCT/GB2020/052894, mailed on Mar. 9, 2021, 13 pages.
International Search Report and Written Opinion received for PCT Patent Application No. PCT/GB2020/052895, mailed on Mar. 5, 2021, 12 pages.
International Search Report and Written Opinion received for PCT Patent Application No. PCT/GB2020/052897, mailed on Mar. 3, 2021, 12 pages.
Julien E. et al., "Sputtered LiCoO2 Cathode Materials for All-solid-state Thin-film Lithium Microbatteries," Materials, vol. 12, No. 17, 2019, 2687, pp. 26.
Knox-Davies et al., "Properties of nanocrystalline GaN films deposited by reactive sputtering," Diamond and Related Materials, Elsevier Science Publishers, vol. 12, No. 8, 2003, pp. 1417-1421.
Office Action received for Japanese Patent Application No. 2022-528153, mailed on Jul. 25, 2023, 7 pages (3 pages of English Translation and 4 pages of Original Document).
Office Action received for Japanese Patent Application No. 2022-528167, mailed on Aug. 29, 2023, 2 pages of Original Document Only.
Kikuchi et al., "Modification of Film Structure in Sputtering Process," Journal of the Vacuum Society of Japan, vol. 50, No. 1, 2007, pp. 14-21.
Office Action received for Japanese Patent Application No. 2022-528173, mailed on Aug. 1, 2023, 4 pages (2 pages of English Translation and 2 pages of Original Document).
Office Action received for Japanese Patent Application No. 2022-528178, mailed on Aug. 8, 2023, 6 pages (3 pages of English Translation and 3 pages of Original Document).
Office Action received for Japanese Patent Application No. 2022-528188, mailed on Aug. 8, 2023, 6 pages (3 pages of English Translation and 3 pages of Original Document).
Office Action received for Japanese Patent Application No. 2022-528189, mailed on Aug. 8, 2023, 6 pages (3 pages of English Translation and 3 pages of Original Document).
Office Action received for Japanese Patent Application No. 2022-528191, mailed on Jun. 27, 2023, 14 pages (8 pages of English Translation and 6 pages of Original Document).
Office Action received for Japanese Patent Application No. 2022-528195, mailed on Jun. 27, 2023, 11 pages (6 pages of English Translation and 5 pages of Original Document).

\* cited by examiner

SPUTTER DEPOSITION

CROSS-REFERENCE TO PRIOR APPLICATION

This application is a § 371 National Stage Application of PCT International Application No. PCT/GB2020/052842 filed Nov. 10, 2020, which claims the priority of United Kingdom Application No. 1916627.1, filed Nov. 15, 2019, each of which are herein incorporated by reference in their entirety.

TECHNICAL FIELD

The present invention relates to deposition, and more particularly to methods and apparatuses for sputter deposition of target material to a substrate.

BACKGROUND

Deposition is a process by which a material is deposited on a substrate. An example of deposition is thin film deposition in which a thin layer (typically from around a nanometre or even a fraction of a nanometre up to several micrometres or even tens of micrometres) is deposited on a substrate, such as a silicon wafer or web. An example technique for thin film deposition is Physical Vapour Deposition (PVD), in which target material in a condensed phase is vaporised to produce a vapour, which vapour is then condensed onto the substrate surface. An example of PVD is sputter deposition, in which particles are ejected from the target as a result of bombardment by energetic particles, such as ions. In examples of sputter deposition, a sputter gas, such as an inert gas, such as argon, is introduced into a vacuum chamber at low pressure, and the sputter gas is ionised using energetic electrons to create a plasma. Bombardment of the target by ions of the plasma ejects target material which may then deposit on the substrate surface. Sputter deposition has advantages over other thin film deposition methods such as evaporation in that target materials may be deposited without the need to heat the target material, which may in turn reduce or prevent thermal damage to the substrate.

The substrate may be stored in a dry room or a clean room prior to or after undergoing sputter deposition, to reduce the risk of contamination. This can make the substrate difficult to handle.

During sputter deposition, the ejected target material and/or the plasma may interact with or coat a chamber in which the deposition is performed. This can reduce the efficiency of the sputter deposition process, e.g. if the sputter deposition process is halted periodically to clean the chamber.

SUMMARY

According to a first aspect of the present invention, there is provided a sputter deposition apparatus comprising:
 a substrate support assembly arranged to support a substrate;
 a target support assembly arranged to support at least one sputter target for use in a sputter deposition of a target material onto the substrate;
 a plasma generation arrangement arranged to provide plasma for said sputter deposition; and
 a cartridge arranged to contain the substrate with deposited target material after said sputter deposition, wherein the cartridge is removable from the sputter deposition apparatus.

With this arrangement, the substrate with deposited target material can be removed from the sputter deposition apparatus, within the cartridge, after the substrate has been processed. The cartridge protects the substrate from contamination, and allows the processed substrate to be handled and/or stored more easily than otherwise. For example, the cartridge may be used to store an atmosphere-sensitive substrate on conventional shelves rather than within a clean room or dry room.

In examples, the cartridge comprises a vacuum chamber arranged to contain at least the portion of the substrate with deposited target material in a vacuum. This may further reduce contamination and/or other degradation of the deposited target material on the substrate, which may otherwise occur due to interactions between the deposited target material and a surrounding environment.

In examples, the cartridge further comprises the target support assembly and the at least one sputter target. In this way, the cartridge may include sputter deposition components that are depleted or altered during sputter deposition. This may improve the efficiency with which the sputter deposition is performed. For example, after use of the at least one sputter target to deposit target material onto the substrate, the cartridge comprising the target support assembly, at least one sputter target and substrate with deposited target material thereon may be removed from the sputter deposition apparatus. A further cartridge, comprising its own target support assembly and at least one sputter target may then be inserted into the sputter deposition apparatus for processing. This may be performed more efficiently than other approaches in which the deposition process is halted to replenish at least one sputter target that has been depleted by the sputter deposition process, before subsequently restarting sputter deposition. This further provides for flexibility in sputter deposition of different target materials onto the substrate. For example, the target material to be deposited onto the substrate may be changed straightforwardly by removing the cartridge and replacing it with a different cartridge comprising a different sputter target comprising a different material.

In examples, the plasma generation arrangement is arranged to provide plasma within a deposition zone of the sputter deposition apparatus, and wherein the cartridge comprises the deposition zone. This allows sputter deposition to be performed within the cartridge. This may reduce contact between debris within the deposition zone (such as material ejected from the at least one sputter target and/or ions of the plasma) and the sputter deposition apparatus, as such debris may be contained within the cartridge instead. This may reduce or obviate the need to clean the sputter deposition apparatus, which may require sputter deposition to be halted. The efficiency of sputter deposition may therefore be improved. In these examples, the plasma generation arrangement may be arranged to generate an electric field and/or a magnetic field for generation and propagation of the plasma, and a casing of the cartridge may comprise a transmissive region at least partially transmissive for the electric field and/or the magnetic field, to generate the plasma within the deposition zone of the cartridge. With this arrangement, the plasma may be within the cartridge rather than within a portion of the sputter deposition apparatus outside the cartridge. Contact between the plasma and the sputter deposition apparatus may be further reduced, which may further reduce the need to clean the sputter deposition apparatus. Efficiency of sputter deposition may therefore be increased.

The cartridge may comprise the substrate, the substrate support assembly, the target support assembly, and the at least one sputter target supported by the target support assembly, and the cartridge may be sealed under vacuum during the sputter deposition. With such a cartridge, the cartridge may include the consumables for the sputter deposition, which may further increase the efficiency of sputter deposition. By sealing the cartridge under vacuum during the sputter deposition, deposition of environment-sensitive target materials onto the substrate may be performed with improved quality. For example, this may the reduce the rate of interactions of the target material and/or the substrate with a surrounding environment.

In some examples in which the plasma generation arrangement is arranged to provide plasma within a deposition zone of the cartridge, the cartridge may comprise an aperture for entry of the plasma into the deposition zone of the cartridge. The aperture may be sealable. This provides further flexibility for the sputter deposition. For example, the plasma may be generated outside the cartridge and may subsequently enter the cartridge. It may be easier to control properties of the plasma, such as a plasma density, by generating the plasma outside the cartridge than otherwise. This may therefore improve control of the sputter deposition of the target material onto the substrate.

In examples, the plasma generation arrangement is arranged to provide plasma for sputter deposition within a deposition zone of the sputter deposition apparatus, wherein the deposition zone is outside the cartridge. This may allow a more compact cartridge to be provided than otherwise, e.g. if the deposition zone is within the cartridge. The cartridge may therefore be stored and/or transported more efficiently than otherwise. In these examples, the sputter deposition apparatus may be arranged to receive the cartridge with the substrate arranged therein, and the sputter deposition apparatus may comprise a transport assembly arranged to: transport at least a portion of the substrate from the cartridge into the deposition zone, to provide for said sputter deposition within the deposition zone; and transport at least the portion of the substrate, after said sputter deposition, into the cartridge. This may further improve the compactness of the cartridge. For example, the transport assembly may be used to appropriately feed the substrate into the and out of the deposition zone in the sputter deposition apparatus, which may be larger than the cartridge itself. In these examples, the sputter deposition apparatus may be arranged to receive the cartridge with the at least one sputter target arranged therein, and the transport assembly may be further arranged to transport the at least one sputter target from the cartridge into the deposition zone, to provide for said sputter deposition within the deposition zone. This may improve the efficiency of the sputter deposition process by providing the at least one sputter target together with the substrate to be processed, while also increasing the compactness of the cartridge, which may be smaller than the deposition zone within the sputter deposition apparatus.

In examples, the substrate support assembly comprises a conveyor system arranged to convey the substrate relative to the at least one sputter target during said sputter deposition. The conveyor system may improve control over the rate at which the substrate is processed, and may therefore improve control over the sputter deposition of the target material onto the substrate. The conveyor system may increase the rate at which the target material is sputter deposited onto the substrate compared to a static substrate support. The efficiency of sputter deposition may therefore be improved.

According to a second aspect of the present invention, there is provided a cartridge for insertion into a sputter deposition apparatus, the cartridge comprising:
  a substrate;
  at least one sputter target for use in sputter deposition of a target material onto the substrate using the sputter deposition apparatus; and
  a chamber for storing the substrate with deposited target material after said sputter deposition.

Such a cartridge may be used to protect the substrate with deposited target material from contamination. The substrate with deposited target material may be handled and/or stored more easily than otherwise. For example, the cartridge may be used to store an atmosphere-sensitive substrate on conventional shelves rather than within a clean room or dry room. By including the at least one sputter target within the cartridge, the sputter deposition apparatus may perform sputter deposition more efficiently than otherwise. For example, after use of the at least one sputter target to deposit target material onto the substrate, the cartridge comprising the target support assembly, at least one sputter target and substrate with deposited target material thereon may be removed from the sputter deposition apparatus. A further cartridge, comprising its own target support assembly and at least one sputter target may then be inserted into the sputter deposition apparatus for processing. This may be performed more efficiently than other approaches in which the deposition process is halted to replenish at least one sputter target that has been depleted by the sputter deposition process, before subsequently restarting sputter deposition. This further provides for flexibility in sputter deposition of different target materials onto the substrate. For example, the target material to be deposited onto the substrate may be changed straightforwardly by removing the cartridge and replacing it with a different cartridge comprising a different sputter target comprising a different material.

In some examples, the chamber is a sealable chamber for containment of a vacuum. This may allow deposition of environment-sensitive target materials onto the substrate to be performed with improved quality. For example, the rate of unwanted interactions of the target material and/or the substrate with a surrounding environment may be reduced. As the chamber is sealable, this also provides for flexibility, as the cartridge may be used for environment-sensitive sputter deposition of target materials onto the substrate (e.g. with the chamber sealed and under vacuum) or for environment-insensitive sputter deposition, such as sputter deposition of inert or unreactive target material onto the substrate. In some cases, the chamber may be a vacuum chamber, which may further reduce unwanted interactions of the components within the chamber with a surrounding environment, for example if these components are reactive.

In examples, the chamber comprises the substrate and the at least one sputter target before and after said sputter deposition. This may further improve the efficiency of the sputter deposition process, which may be performed upon insertion of the cartridge into the sputter deposition apparatus. In some cases, the chamber may comprise the substrate and the at least one sputter target during said sputter deposition, which may allow sputter deposition to be performed within the cartridge. In these examples, the chamber may comprise a conveyor system arranged to convey the substrate relative to the at least one sputter target during said sputter deposition. This may improve control over the rate at which the substrate is processed, and may therefore improve control over the sputter deposition of the target material onto the substrate. The conveyor system may increase the rate at which the target material is sputter deposited onto the substrate compared to a static substrate support. The efficiency of sputter deposition may therefore be improved. The conveyor system may comprise a roller. In such case, the conveyor system may be or form part of a "reel-to-reel" process arrangement, which may process the substrate in an efficient manner.

In examples, the cartridge comprises an aperture for entry of a plasma generated by the sputter deposition apparatus. The aperture may be sealable. This provides further flexibility for the sputter deposition. For example, the plasma may be generated outside the cartridge and may subsequently enter the cartridge. It may be easier to control properties of the plasma, such as a plasma density, by generating the plasma outside the cartridge than otherwise. This may therefore improve control of the sputter deposition of the target material onto the substrate.

In examples, wherein a casing of the cartridge comprises a transmissive region at least partially transmissive for an electric field and/or a magnetic field generated by the sputter deposition apparatus, for generation of a plasma within the cartridge. This may reduce contact between debris within the deposition zone (such as material ejected from the at least one sputter target and/or ions of the plasma) and the sputter deposition apparatus, as such debris may be contained within the cartridge instead. This may reduce or obviate the need to clean the sputter deposition apparatus, which may require sputter deposition to be halted. The efficiency of sputter deposition may therefore be improved.

In examples, the substrate is flexible, and the chamber comprises a reel for supporting the substrate with deposited target material after said sputter deposition. This may facilitate sputter deposition of the target material onto the substrate using a "reel-to-reel" process arrangement, which may process the substrate in an efficient manner. This may additionally or alternatively provide an efficient manner for supporting the substrate, which may be more compact than other arrangements. In these examples, the reel may be a second reel and the cartridge may comprise a first reel for supporting the substrate before said sputter deposition. This may further facilitate the use of an efficient "reel-to-reel" deposition process.

In examples, the cartridge comprises a transport assembly arranged to transport the substrate and/or the at least one sputter target out of the cartridge. This may allow the substrate and/or the at least one sputter target to be easily removed from the cartridge after the target material has been sputter deposited thereon and/or after the material of the at least one target has been depleted. In some cases, this may allow for sputter deposition to occur outside the cartridge. The cartridge may therefore be more compact than if the sputter deposition is performed within the cartridge.

In examples, the target material comprises material for an electrode layer or an electrolyte layer of an energy storage device. In these examples, the cartridge may therefore be used for the manufacture of an energy storage device.

According to a third aspect of the present invention, there is provided a sputter deposition apparatus comprising:
- a cartridge support assembly arranged to support a cartridge comprising a substrate and at least one sputter target for use in sputter deposition of a target material onto the substrate using the sputter deposition apparatus, such that the cartridge is removable from the sputter deposition apparatus; and
- a plasma generation arrangement arranged to provide plasma for said sputter deposition.

With this arrangement, the substrate with deposited target material can be removed from the sputter deposition apparatus, within the cartridge, after the substrate has been processed. The cartridge protects the substrate from contamination, and allows the processed substrate to be handled and/or stored more easily than otherwise. For example, the cartridge may be used to store an atmosphere-sensitive substrate on conventional shelves rather than within a clean room or dry room. The sputter deposition apparatus according to the third aspect may facilitate such a sputter deposition process.

In examples, the plasma generation arrangement is arranged to provide the plasma for said sputter deposition within a deposition zone of the sputter deposition apparatus, wherein the cartridge comprises the deposition zone. This allows sputter deposition to be performed within the cartridge. This may reduce contact between debris within the deposition zone (such as material ejected from the at least one sputter target and/or ions of the plasma) and the sputter deposition apparatus, as such debris may be contained within the cartridge instead. This may reduce or obviate the need to clean the sputter deposition apparatus, which may require sputter deposition to be halted. The efficiency of sputter deposition may therefore be improved.

In examples, the sputter deposition apparatus comprises a transport assembly arranged to: transport at least the portion of the substrate from the cartridge into a deposition zone of the sputter deposition apparatus, to provide for said sputter deposition within the deposition zone, wherein the deposition zone is outside the cartridge; and transport at least the portion of the substrate, after said sputter deposition, into the cartridge. This may allow a more compact cartridge to be provided than otherwise, e.g. if the deposition zone is within the cartridge. The cartridge may therefore be stored and/or transported more efficiently than otherwise. For example, the transport assembly may be used to appropriately feed the substrate into the and out of the deposition zone in the sputter deposition apparatus, which may be larger than the cartridge itself.

The transport assembly may be further arranged to transport the at least one sputter target from the cartridge into the deposition zone, to provide for said sputter deposition within the deposition zone. This may improve the efficiency of the sputter deposition process by providing the at least one sputter target together with the substrate to be processed, while also increasing the compactness of the cartridge, which may be smaller than the deposition zone within the sputter deposition apparatus.

Further features will become apparent from the following description, given by way of example only, which is made with reference to the accompanying drawings.

DETAILED DESCRIPTION

Figure 1A:
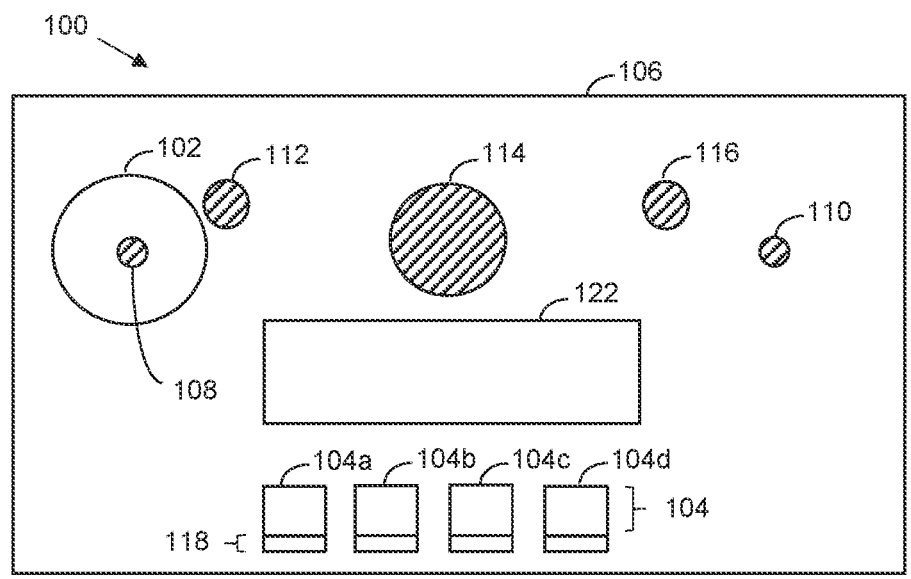
FIG. 1a is a schematic diagram of a cartridge for insertion into a sputter deposition apparatus according to examples, prior to deposition of target material onto a substrate.

Details of apparatuses and methods according to examples will become apparent from the following description, with reference to the Figures. In this description, for the purpose of explanation, numerous specific details of certain examples are set forth. Reference in the specification to "an example" or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Examples herein relate to a cartridge arranged to contain a substrate with deposited target material after sputter deposition of the target material onto the substrate. Such a cartridge may be inserted into a sputter deposition apparatus for receipt of the substrate after sputter deposition, and subsequently removed from the sputter deposition apparatus. The cartridge protects the substrate from contamination, and may be easily handled and stored.

The cartridge may be used to store a substrate (or portion thereof) which is sensitive to a surrounding atmosphere or which is hazardous. For example, a layer of target material sputter deposited onto the portion of the substrate may react with molecules that come into contact with the layer, which may unduly affect surface properties of the layer. However, by storing the substrate in the cartridge, the layer may be prevented from coming into contact with such molecules. Environmental conditions within the cartridge may be controlled more easily than in larger spaces. For example, conditions within the cartridge, such as a pressure, temperature, gas composition etc., may be adapted to avoid or limit unwanted degradation of the substrate. The cartridge may therefore be used to store an atmosphere-sensitive substrate on conventional shelves rather than within a clean room or dry room. The cartridge may in addition be used to transport the substrate to a desired location for subsequent processing, without the substrate coming into contact with contaminants or atmospheric conditions that may damage or degrade the substrate or a layer of target material sputter deposited onto the substrate.

In some cases, the sputter deposition of the target material onto the substrate may occur within the cartridge itself, but with the cartridge inserted in the sputter deposition apparatus. This may reduce contact between the target material and/or a plasma and the sputter deposition apparatus. The sputter deposition apparatus may therefore be cleaned less frequently, improving the efficiency of sputter deposition.

Examples of cartridges will first be described before subsequently describing examples of sputter deposition apparatuses into which such cartridges may be inserted. The cartridges and sputter deposition apparatuses described herein may be used for plasma-based sputter deposition for a wide number of industrial applications, such as those which have utility for the deposition of thin films, such as in the production of optical coatings, magnetic recording media, electronic semiconductor devices, light emitting diodes (LEDs), energy generation devices such as thin-film solar cells, and energy storage devices such as batteries, e.g. thin-film batteries. Therefore, while the context of the present disclosure may in some cases relate to the production of energy storage devices or portions thereof, it will be appreciated that the apparatuses and methods described herein are not limited to the production thereof.

Figure 1B:
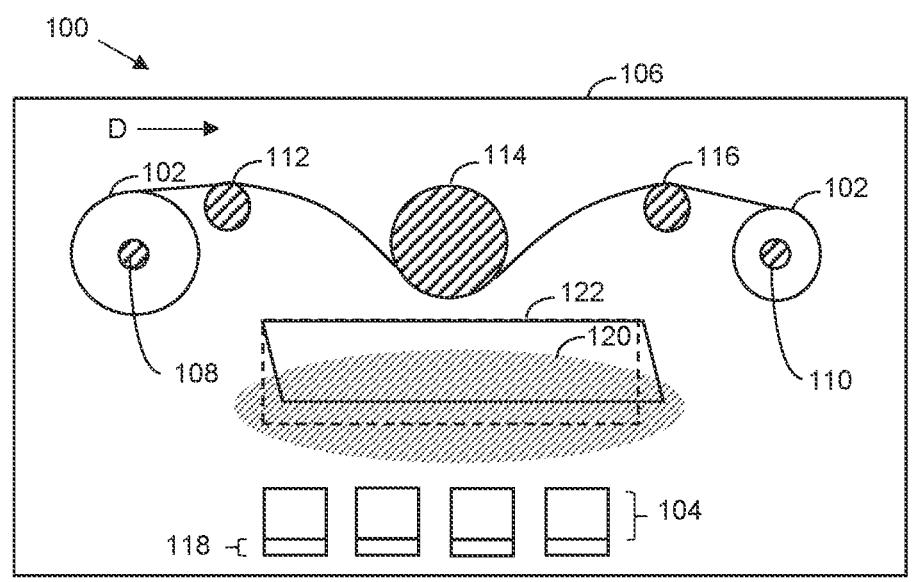
FIG. 1b is a schematic diagram of the cartridge of FIG. 1a during deposition of the target material onto the substrate.
Figure 1C:
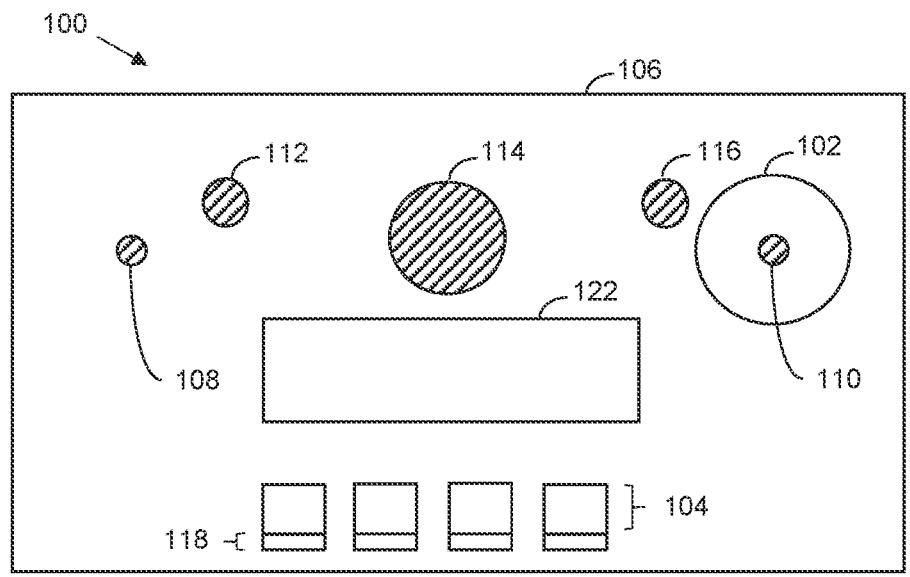
FIG. 1c is a schematic diagram of the cartridge of FIGS. 1a and 1b after deposition of the target material onto the substrate.

FIGS. 1*a* to 1*c* (referred to collectively as FIG. 1) are schematic diagrams showing a cartridge 100 for insertion into a sputter deposition apparatus, according to examples. FIG. 1*a* shows the cartridge 100 prior to sputter deposition, FIG. 1*b* shows the cartridge 100 during sputter deposition, and FIG. 1*c* shows the cartridge after sputter deposition.

In FIG. 1, the cartridge 100 includes a substrate 102, at least one sputter target 104 for use in sputter deposition of a target material onto the substrate 102 using a sputter deposition apparatus, and a chamber 106. The chamber 106 in this case includes the substrate 102 and the at least one sputter target 104 before and after sputter deposition of the target material onto the substrate. However, in other cases (such as that of FIG. 2), the chamber may be arranged to store the substrate with deposited target material after sputter deposition. In such cases the chamber need not include the substrate prior to deposition, nor the at least one sputter target.

A cartridge 100 is for example any suitable container for containing the substrate after sputter deposition and which is designed for insertion into a sputter deposition apparatus. The cartridge 100 for example includes elements that are processed by the sputter deposition apparatus (including the substrate 102), and which may be depleted or otherwise changed by the sputter deposition process. For example, the material of the sputter targets may be gradually depleted by the sputter deposition process, and the substrate 102 may be changed by virtue of deposition of a layer of target material on a surface of the substrate 102. The cartridge 100 may be referred to as a cassette. The cartridge 100 of FIG. 1 is cuboid in shape, with a rectangular cross-section (illustrated in FIG. 1). In this case, the cartridge 100 has a cuboid shell, and is hollow. This is merely an example though, and the cartridge 100 may have other shapes in other examples. The hollow region within the cartridge 100 corresponds to a chamber 106, which in this example is the cavity of the cartridge 100. At least one wall of the chamber 106 may be a wall of the cartridge 100 (which may be referred to as a shell, casing or a housing). This is shown in FIG. 1, in which the casing of the cartridge 100 corresponds to a perimeter of the chamber 106. In other cases, though, the chamber may be a separate chamber within the cartridge 100, for example with at least one wall which does not form part of a casing of the cartridge.

The chamber 106 may be a sealable chamber for containment of a vacuum. For example, a pressure within the chamber 106 may be adjusted appropriately, to create vacuum conditions within the chamber 106 when desired. The chamber may then be sealed to maintain a desired pressure.

In FIG. 1, the chamber 106 is a vacuum chamber and is therefore under vacuum conditions prior to, during, and after sputter deposition. This may reduce contamination of the substrate 102 within the chamber 106, for example due to reactions between the substrate 102 and molecules, such as those of a gas, within the chamber 106. It is to be appreciated that a vacuum as referred to herein is not necessarily a perfect vacuum, but instead refers to an environment in which the pressure is lower than atmospheric pressure, such as a pressure which is sufficiently low to avoid or at least significantly reduce unwanted interactions between the substrate 102 and other materials, or a pressure that is appropriate for sputter deposition. For example, a low pressure suitable for sputter deposition may be $3 \times 10^{-3}$ torr or less. The chamber 106 may be evacuated by a pumping system (not shown) to a suitable pressure (for example less than $1 \times 10^{-5}$ torr), and in use a process or sputter gas, such as argon or nitrogen, may be introduced into the chamber 106 using a gas feed system (not shown) to an extent such that a pressure suitable for sputter deposition is achieved (for example $3 \times 10^{-3}$ torr). In such cases, the chamber 106 may be evacuated before the substrate 102 is loaded into the chamber 106 or afterwards.

In other cases, the chamber 106 may not be under vacuum conditions, and may instead be at atmospheric pressure, for example. The use of a vacuum or otherwise may depend on the substrate 102 and the target material to be deposited on the substrate 102. For example, in some cases, a vacuum may not be needed as the substrate 102 and/or the target material to be deposited on the substrate 102 may be inert or less likely to react with components in a surrounding environment. The target material may be or include material of the sputter target, for example if the sputter deposition is non-reactive sputter deposition. In other cases, though, the target material may be obtained by a reaction or other interaction between material ejected from the sputter targets 104 and a reactive material, such as a reactive gas. In these cases, the deposition may be considered to be reactive sputter deposition, and the target material may be derived from the material of at least one sputter target.

In the example of FIG. 1, the substrate 102 is a web of substrate, although in other cases the substrate may be of a different form. A web of substrate for example refers to a flexible or otherwise bendable or pliable substrate. Such a substrate may be sufficiently flexible to enable bending of the substrate around rollers, for example as part of a roll-to-roll feeding system. In other cases, though, the substrate may be relatively rigid or inflexible. In such cases, the substrate may be conveyed by the conveyor system without bending the substrate or without bending the substrate a substantial amount.

The substrate 102 may be or include silicon or a polymer. In some examples, for example for the production of an energy storage device, the substrate 102 may be or include nickel foil, but it will be appreciated that any suitable metal could be used instead of nickel, such as aluminium, copper or steel, or a metallised material including metallised plastics such as aluminium on polyethylene terephthalate (PET).

The substrate 102 is supported by a substrate support system, which in this case includes a first reel 108 for supporting the substrate 102 before sputter deposition (as shown in FIG. 1a) and a second reel 110 for supporting the substrate 102 after sputter deposition (as shown in FIGS. 1b and 1c). This is merely an example, though, and in other cases the substrate 102 may be supported by a substrate support system of a different form. A reel is for example a cylindrical element onto which the substrate 102 may be wound, and may be referred to as a spool.

The chamber 106 also includes a conveyor system, which in this case forms part of the substrate support system. The conveyor system is arranged to convey the substrate 102 relative to the at least one sputter target 104 during the sputter deposition. The conveyor system may comprise curved member, such as a roller. FIG. 1 shows such an example. In FIG. 1, the conveyor system comprises a drum 114, a first roller 112 arranged to feed or otherwise guide the substrate 102 from the first reel 108 onto the drum 114, and a second roller 116 arranged to feed or otherwise guide the substrate 102 from the drum 114, and onto the second reel 110. The conveyor system 110 in this case forms part of a "reel-to-reel" process arrangement, where the substrate 102 is fed from the first reel 108, undergoes sputter deposition, and is then fed onto the second reel 110 to form a loaded reel of processed substrate (as shown in FIG. 1c).

An end of the substrate 102 may initially be guided from the first reel 108 towards, and in some cases through, the conveyor system by a feeding mechanism (not shown). The feeding mechanism for example guides the end of the substrate 102 onto the second reel 110, through the conveyor system. Subsequent movement of the substrate 102 may then be performed by the conveyor system, for example in conjunction with rotation of the first reel 108 and the second reel 110, to gradually transfer the substrate 102 from the first reel 108 and onto the second reel 110. In other cases, though, an end of the substrate 102 or a leader or other material coupled to the end of the substrate 102 may already be at least partially wound round or supported by the second reel 110. In such cases, the cartridge 100 may not include a feeding mechanism. Instead, the substrate 102 may be gradually unwound from the first reel 108 and onto the second reel 110 by the conveyor system and by rotation of the first and second reels 108, 110.

The conveyor system is arranged to convey the substrate 102 in a conveyance direction D (shown in FIG. 1b) relative to the at least one sputter target 104, to provide for sputter deposition of the target material, which for example includes or is derived from material of the at least one target 104, onto the substrate 102. The conveyance direction D may be considered to correspond to the general direction of motion of the substrate 102 from the first reel 108 to the second reel 110, which may be considered an aggregate direction of motion of the substrate 102. Where the conveyor system includes a roller (such as the drum 114), the conveyance direction D may correspond to a direction of rotation of the roller, which may be taken at a tangent to an uppermost point of the roller. In such cases, the conveyor system may be arranged to convey the substrate 114 in a conveyance direction D which is perpendicular to an axis of rotation of the roller (in this case, the drum 114).

In FIG. 1, the cartridge 100 includes four sputter targets 104a-104d (collectively referred to with the reference numeral 104), although this is merely an example. The sputter targets 104 may include the same material as each other, or one or more of the sputter targets 104 may comprise different material than another one of the sputter targets 104.

The sputter targets 104 are supported by one or more target support assemblies 118. In some examples, the target support assemblies 118 may include at least one plate or other support structure that supports or holds the sputter targets 104. In FIG. 1, there is one target support assembly per sputter target. However, in other cases, there may be more or fewer target support assemblies per sputter target.

For example, a single target support assembly may support more than one sputter target, such as all of the sputter targets within the chamber.

The target material deposited onto the substrate 102 may be or include material of the sputter targets 104, or material that is formed by an interaction of the material of the sputter targets 104 with a further material. In some examples, the target material comprises material for an electrode layer or an electrolyte layer of an energy storage device. For example for the production of an energy storage device, the target material may be or include, or may be or include a precursor material for, a cathode layer of an energy storage device, such as a material which is suitable for storing lithium ions, such as lithium cobalt oxide, lithium iron phosphate or alkali metal polysulphide salts. Additionally or alternatively, the target material may be or include, or may be or include a precursor material for, an anode layer of an energy storage device, such as lithium metal, graphite, silicon or indium tin oxides. Additionally or alternatively, the target material may be or include, or may be or include a precursor material for, an electrolyte layer of an energy storage device, such as material which is ionically conductive, but which is also an electrical insulator, such as lithium phosphorous oxynitride (LiPON). For example, the material of at least one of the sputter targets may be or include LiPO as a precursor material for the deposition of LiPON onto the substrate 102, for example via reaction with a gas (such as nitrogen gas), which may be fed into the chamber 106 during sputter deposition.

The cartridge 100 in this case may be used to store the sputter targets 104 and the substrate 102. The sputter targets 104 may be sensitive to atmospheric conditions. For example, the material of the sputter targets 104 may react with certain molecules in the air or may undergo undesired phase transitions if stored in air at atmospheric pressure and temperature. For example, some materials (such as those comprising lithium) have a relatively low sublimation point. Such materials may therefore undergo sublimation at room temperature, rather than remaining in a solid phase (for sputter deposition). However, the conditions within the cartridge 100 may be arranged to avoid or limit undesired changes in a nature of material of the sputter targets 104 within the cartridge 100, such as reactions and/or phase transitions. Control of the conditions within the cartridge 100 may be more straightforward than controlling environmental conditions within a larger space, such as that of the sputter deposition apparatus as a whole.

Where the cartridge 100 is used to deposit layers on a substrate 102 for an energy storage device, the deposited layers may be at risk of short-circuits, e.g. if there are any defects in the deposition of layers. For example, a defect in the deposition of an electrolyte layer may create a short circuit between a cathode layer and an anode layer. For stacks of layers with a large surface area, the capacity of the cell is large. A short circuit may therefore cause a thermal run-away event, which may cause the material to spontaneously ignite. However, the cartridge 100 may store a substrate 102 with a sufficiently small surface area such that, after deposition of the layers on the substrate 102, the capacity of the stack of the layers is sufficiently small that the risk of thermal run-away is reduced, even in the presence of defects. The safety of the sputter deposition process may therefore be improved.

In the example of FIG. 1, the sputter deposition occurs within the cartridge 100 (in this case, within the chamber 106) rather than externally. The cartridge 100 therefore contains the materials that are ejected during the sputter deposition, which may remain within the cartridge 100 rather than coating a sputter deposition apparatus into which the cartridge 100 is inserted. This may therefore obviate or reduce the need to clean the sputter deposition apparatus, reducing the need to halt operation of the sputter deposition apparatus. This can improve the efficiency of sputter deposition.

In this case, a plasma 120 is confined within the cartridge 100 during sputter deposition (as shown in FIG. 1b). Ions of the plasma 120 bombards the sputter targets 104, causing material to be ejected from the sputter targets 104. The ejected material may be deposited on a surface of the substrate 102 as the target material as the substrate 102 is conveyed by the conveyor system from the first reel 108 to the second reel 110. In other cases, the ejected material may be interacted with a further material, such as a gas, before deposition on the surface of the substrate 102 as the target material. The plasma 120 may be generated within the cartridge 100 during sputter deposition, or may be generated externally of the cartridge 100 and subsequently confined within the cartridge 100.

In this case, the cartridge 100 comprises an aperture 122 for entry of a plasma generated by the sputter deposition apparatus. In the example of FIG. 1, the aperture 122 is a door, which is for example a moveable barrier at an entrance to the cartridge 100. In other cases, though, the aperture may have a different form, such as a hole or other opening. Such an aperture may be sealable. Sealing of the aperture for example refers to closing the aperture in a manner in which a given material (such as the plasma 120) is prevented from entering or exiting the cartridge 100. For example, a hole may be filled with a stopper, or a door may be moved to a closed position and sealed e.g. using a suitable sealant or adhesive. Sealing of the cartridge 100 may be performed reversibly, to allow the cartridge 100 to be reopened. In some cases, the aperture 122 may also be configured to allow the substrate 102 to be removed from the cartridge 100, after sputter deposition, via the aperture 122. In other cases, though, the cartridge 100 may comprise a further aperture or other opening through which the substrate 102 may be removed from the cartridge 100.

In examples, the aperture 122 is opened upon or after insertion of the cartridge 100 into the sputter deposition apparatus. With the aperture 122 open, a plasma generated remotely of the cartridge 100 may subsequently enter into, and be confined within, the cartridge 100, for sputter deposition of the target material on the substrate 102 in the cartridge 100. After the sputter deposition has ceased, e.g. after the substrate 102 has been transferred from the first reel 108 to the second reel 110, the aperture 122 may be closed and sealed. This may therefore prevent other materials from subsequently entering the cartridge 100. For example, the aperture 122 may be closed and/or sealed before the cartridge 100 is ejected from the sputter deposition apparatus. FIGS. 1a and 1c show the aperture 122 in a closed position, and FIG. 1b shows the aperture 122 in an open position.

After closure of the aperture 122, a pressure of the cartridge 100 may be adjusted appropriately to reduce contamination. For example, the cartridge 100 (or the chamber 106 of the cartridge 100) may be evacuated after closure of the aperture 122, and before removal of the cartridge 100 from the sputter deposition apparatus. The cartridge 100 may therefore be sealed under vacuum during the sputter deposition. The aperture 122 may then be re-opened, to remove the substrate 102 from the cartridge 100, e.g. for further processing. The substrate 102 may not be removed from the cartridge 100 immediately after sputter deposition, though. Instead, the substrate 102 may be stored within the cartridge 100 for a period of time before removal. The cartridge 100 may further be used to transport the substrate 102. For example, the substrate 102 can be transported straightforwardly, under vacuum conditions within the cartridge 100 (if the chamber 106 of the cartridge 100, or the cartridge 100 itself, is held under vacuum). The cartridge 100 and/or the sputter deposition apparatus may include suitable gas coupling mechanisms that can be used to pressurise and/or depressurise the cartridge 100 while it is within the sputter deposition apparatus or otherwise, such as before or after sputter deposition has occurred.

Figure 2:
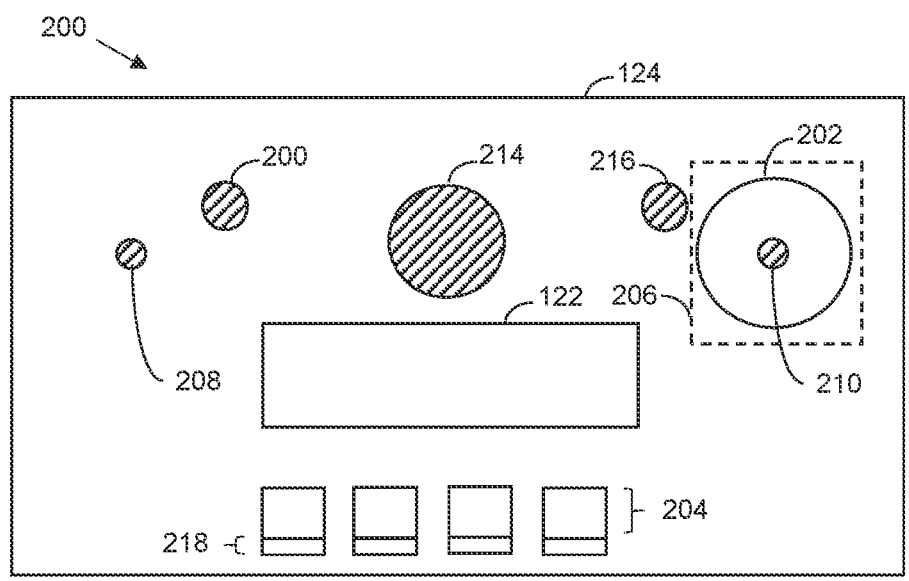
FIG. 2 is a schematic diagram of a cartridge for insertion into a sputter deposition apparatus according to further examples, after deposition of a target material onto a substrate.

FIG. 2 is a schematic diagram of a cartridge 200 for insertion into a sputter deposition apparatus according to further examples. Features of FIG. 2 that are similar to corresponding features of FIG. 1 are labelled with the same reference numerals but incremented by 100. Corresponding descriptions are to be taken to apply. FIG. 2 shows the cartridge 200 after sputter deposition of target material onto the substrate 202.

The cartridge 200 of FIG. 2 is the same as the cartridge 100 of FIG. 1, except that the cartridge 200 of FIG. 2 includes a separate chamber 206 for storing the substrate 202 after sputter deposition. Hence, a cavity 124 of the cartridge 200 of FIG. 2 includes the chamber 206, but the chamber 206 does not fill an entirety of the cavity 124. In this case, the chamber 206 may be a removeable chamber, which may be removed from the cartridge 200 after the substrate 202 (which may be a portion of a large substrate or the entire substrate 202) is stored therein after sputter deposition.

The chamber 206 may be a sealable chamber for containment of a vacuum. For example, the chamber 206 may have at least one aperture e.g. for entry of the substrate 202 after sputter deposition and/or for removal of unwanted materials, such as excess gas, within the chamber 206. The aperture may be the same as, similar to or different from the aperture 122 of the cartridge 100 of FIG. 1. The aperture may have a different size and/or shape, e.g. to allow the substrate 202 and/or gas to enter and/or exit the chamber 206. For example, gas may be evacuated from the chamber 206 after the substrate 202 has entered the chamber 206, after sputter deposition, to create a vacuum within the chamber 206. In this way, the substrate 202 may be stored in vacuum conditions, which may reduce degradation of a deposited layer on the substrate 202 which may otherwise occur, e.g. due to interactions between the layer and gas molecules at atmospheric pressure. In other cases, the vacuum may be created within the chamber 206 before or during sputter deposition. Conditions within the chamber 206 may be different from other regions of the cartridge 200. For example, the chamber 206 may comprise a vacuum, whereas other regions of the cartridge 200 may be at atmospheric pressure. In other cases, though, conditions within the cartridge 200 may be uniform. For example, the cavity 124 of the cartridge 200 (including the chamber 206) may be under vacuum.

Figure 3A:
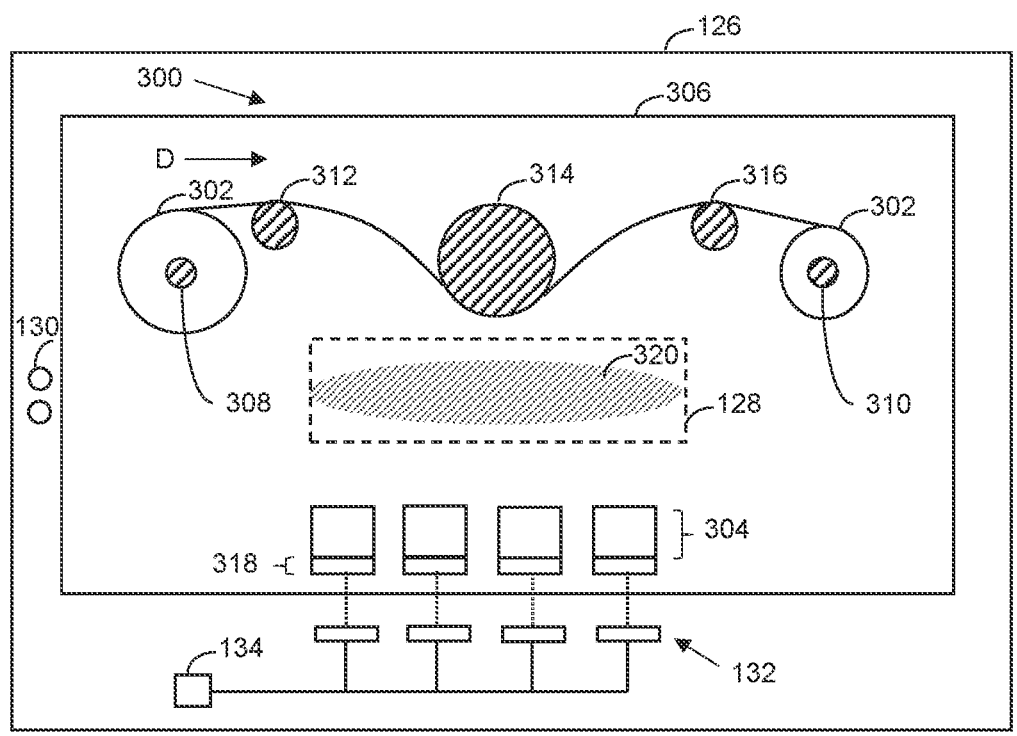
FIG. 3*a* is a schematic diagram of a sputter deposition apparatus according to examples, with a cartridge inserted therein.

FIG. 3a is a schematic diagram of a sputter deposition apparatus 126 according to examples, with a cartridge 300 inserted therein. The cartridge 300 of FIG. 3a is the same as the cartridge 100 of FIG. 1, except that a casing of the cartridge 300 comprises a transmissive region 128 rather than an aperture 122. Features of the cartridge 300 of FIG. 3a that are similar to corresponding features of the cartridge 100 of FIG. 1 are labelled with the same reference but incremented by 200; corresponding descriptions are to be taken to apply.

The sputter deposition apparatus 126 of FIG. 3a comprises a plasma generation arrangement 130 arranged to provide plasma 320 for sputter deposition of target material on the substrate 302. The plasma generation arrangement 130 may include one or more antennas through which appropriate radio frequency power may be driven by a radio frequency power supply system. In this way an inductively coupled plasma 320 may be generated from a process or sputter gas. In this case, the process or sputter gas may be within the cartridge 300. For example, the cartridge 300 may comprise or be connectable to a suitable gas supply system to provide the process or sputter gas within the cartridge 300, for example within the chamber 306. However, in other cases (such as that of FIG. 1), the process or sputter gas may be outside the cartridge, such as within other regions of the sputter deposition apparatus 126. The plasma in such cases may then be generated externally of the cartridge and may subsequently enter the cartridge, e.g. via an aperture. In this way, the plasma generation arrangement 130 may be arranged to provide the plasma 320 for sputter deposition within a deposition zone of the sputter deposition apparatus 126, in which sputter deposition of the target material including or otherwise derived from material of the sputter targets 304 onto the substrate 302 occurs. The cartridge 300 comprises the deposition zone in this case. However, in other examples, such as that of FIG. 4, the deposition zone may be outside the cartridge.

In some examples, the plasma 320 may be generated by driving a radio frequency current through one or more antennas, for example at a frequency between 1 MHz and 1 GHz; a frequency between 1 MHz and 100 MHz; a frequency between 10 MHz and 40 MHz; or at a frequency of approximately 13.56 MHz or multiples thereof. The radio frequency power causes ionisation of the process or sputter gas to produce plasma 320.

One or more antennas of the plasma generation arrangement 130 may be elongate antennas, which may be elongate perpendicular to a conveyance direction D in which the substrate 302 is conveyed during sputter deposition. In such cases, the elongate antennas may extend in a direction parallel to an axis of rotation of a drum 314 which is used to convey the substrate 302 relative to the sputter targets 304, during sputter deposition. While in some cases, the antennas may be linear in shape, in other cases the antennas may be curved. For example, the antennas may have a half-moon shape.

In the example of FIG. 3a, the plasma generation arrangement 130 is located to one side of the cartridge 300, with the cartridge 300 inserted in the sputter deposition apparatus 126. In other examples, though, the plasma generation arrangement may include at least two antennas that are disposed laterally from each other, for example at opposite sides of the cartridge 300. For example, such antennas may extend parallel to each. This for example allows for precise generation of the plasma 320 in the vicinity of the cartridge 300.

The sputter deposition apparatus 126 in examples such as that of FIG. 3 may further include a confining arrangement (not shown). The confining arrangement may include one or more magnetic elements arranged to provide a confining magnetic field to at least partly confine the plasma 320 in a suitable region to provide for sputter deposition of a target material onto the substrate 302 in use. For example, the confining arrangement may be used to at least partly confine the plasma within the cartridge in examples in which the plasma is generated outside the cartridge and is subsequently within the cartridge.

In FIG. 3a, the sputter deposition apparatus 126 includes the cartridge 300, as the cartridge 300 has been inserted into the sputter deposition apparatus 126. The cartridge 300 is arranged to contain the substrate 302 with deposited target material after sputter deposition of the target material on the substrate 302. The cartridge 300 is removable from the sputter deposition apparatus 126. The cartridge 300 being removable for example means that the cartridge 300 can be ejected or otherwise extracted from the sputter deposition apparatus 126 without damaging the sputter deposition apparatus. For example, the sputter deposition apparatus 126 may include an ejection mechanism to eject the cartridge 300 from the sputter deposition apparatus 126.

In this case, a casing of the cartridge 300 includes a transmissive region 128, which is at least partially transmissive for an electric field and/or a magnetic field generated and propagated by the sputter deposition apparatus 126, for generation of the plasma 320 within the cartridge 300. The transmissive region 128 for example comprises or is formed of quartz. In this case, the electric and/or magnetic field may be generated and propagated by the plasma generation arrangement 130 for generation of the plasma 320. The plasma generation arrangement 130 is outside the cartridge 300 in this case. However, the electric and/or magnetic field may propagate within the cartridge 300, via the transmissive region 128. In this way, the plasma 320 may be generated within the cartridge 300, within what may be considered to be a deposition zone of the cartridge 300, in which sputter deposition of the target material onto the substrate 302 occurs.

In examples such as this, gas (such as air) may be evacuated from the cartridge 300 prior to the sputter deposition, and in some cases prior to loading the substrate 302 into the cartridge 300. During the sputter deposition, though, a suitable process or sputter gas, such as argon or nitrogen, may be pumped into the cartridge 300, for generation of the plasma 320 within the cartridge 300. For example, a reactive gas like nitrogen, oxygen, ammonia, nitrogen oxide and/or helium may enter the cartridge 300 via a suitable inlet, and may interact with the material ejected from the sputter targets 304 by the plasma 320 to perform reactive deposition of a target material on the substrate 302. During reactive deposition, at least one non-reactive gas (such as argon) may also be injected into the cartridge 300. In reactive deposition, a gas in a deposition zone (which in this case is within the cartridge 300), which may be injected into the deposition zone, may comprise one or more chemical elements and/or molecules that may chemically react with the ejected material of the sputter targets 304. As a result, the ejected material and the elements and/or molecules of the reactive gas may chemically react, yielding one or more materials for deposition on the substrate 302 as the target material.

In this example, the transmissive region 128 extends over less than all of the casing of the cartridge 300. For example, the transmissive region 128 may be considered to be a transmissive window in a side of the cartridge 300. In other cases, though, an entirety or a majority of the casing of the cartridge 300 may be transmissive for such an electric and/or magnetic field.

The sputter deposition apparatus 126 of FIG. 3a further includes a substrate support assembly arranged to support a substrate 302 and a target support assembly 318 arranged to support at least one sputter target 304 for use in sputter deposition of a target material onto the substrate 302. The target support assembly 318 of FIG. 3a is electrically connected (shown schematically with dashed lines in FIG. 3a) to electrodes 132, via which voltages may be applied to electromagnets associated with the sputter targets 304. The voltages applied to the electromagnets are controlled by a suitable controller 134. Such a controller 134 may include a processor such as a microprocessor which is arranged to control the current through the electromagnet, which in turn controls the magnetic field strength provided by the electromagnet. References herein to control of a magnetic field may be considered to refer to control of any characteristic of the magnetic field, including the magnetic field strength.

The electromagnets may be controlled to provide per-target biasing, allowing the magnetic field associated with different respective sputter targets to be controlled, e.g. to confine the plasma 320 in a region adjacent to different sputter targets, as desired. By controlling the magnetic field associated with different sputter targets, deposition of material of the different sputter targets may in turn be controlled, for example to deposit a greater quantity of material of or derived from one sputter target than another.

In this example, the cartridge 300 itself includes the substrate support assembly, which comprises the first and second reels 308, 310, the first and second rollers 312, 316 and the drum 314. The cartridge 300 also includes the target support assembly 318 and at least one sputter target 304 supported by the target support assembly 318. However, in other cases, a region of the sputter deposition apparatus external to the cartridge may comprise the substrate support assembly and/or the target support assembly. As explained with reference to FIG. 1, the substrate support assembly may include a conveyor system arranged to convey the substrate relative to the at least one sputter target 304 during the sputter deposition.

In the example of FIG. 3a, the substrate 302 is within the cartridge 300 throughout the sputter deposition process. In examples such as this, the cartridge 300 may be sealed under vacuum during the sputter deposition. This may further reduce contamination of the sputter deposition apparatus 126 by materials ejected during the sputter deposition or the plasma 320 itself.

After transferring the substrate 302 from the first reel 308 to the second reel 310, the sputter deposition process may halt. For example, the plasma generation arrangement 130 may be switched off. The cartridge 300 may then be removed from the sputter deposition apparatus 126, and may then be transferred for further processing, or stored. After removal of the cartridge 300 from the sputter deposition apparatus 126, a further cartridge may be inserted into the sputter deposition apparatus 126, which may be similar to the cartridge 300 of FIG. 3a. The sputter deposition process may then be performed again, using the further cartridge. This process may be performed repeatedly, to deposit target material on a plurality of substrates each stored in a different respective cartridge. The sputter deposition apparatus 126 may be cleaned between removal of one cartridge and insertion of a subsequent cartridge. However, the sputter deposition apparatus 126 may be cleaned less frequently than sputter deposition apparatuses without a cartridge, as the cartridge 300 may limit contact between dirtying components of the sputter deposition process (such as material ejected from the sputter targets 304, and plasma 320) and elements of the sputter deposition apparatus 126 (such as a housing of the sputter deposition apparatus 126, the plasma generation arrangement 130, electronic circuitry for controlling sputter target biasing or plasma generation, such as the controller 134 and the electrodes 132, and/or magnetic elements for confining the plasma).

After sputter deposition of the target material onto the substrate 302, and after removal of the cartridge 300 containing the substrate 302 with deposited target material thereon from the sputter deposition apparatus 126, the substrate 302 may subsequently be removed from the cartridge 300. For example, the substrate 302 may be removed and subsequently incorporated in an energy storage device. The cartridge 300 may then undergo a replenishment process in which a new substrate, onto which target material is to be deposited, is loaded onto the first reel 308. If at least one of the sputter targets 304 is depleted or exhausted, the at least one sputter target may be replaced with a replenished sputter target. In some cases, at least one of the sputter targets may be replaced with a sputter target comprising a different material, allowing the cartridge 300 to be re-used for deposition of a different target material onto a substrate. The replenishment of the at least one sputter target may be performed under vacuum conditions if the sputter target is sensitive to atmospheric conditions, e.g. if the sputter target comprises lithium. During such a replenishment process, an interior of the cartridge 300 may be cleaned to remove debris from the previous sputter deposition process. However, this may be performed while the sputter deposition apparatus 126 is used to process another cartridge, meaning that the sputter deposition process may continue more efficiently than otherwise.

In other cases, at least one of the sputter targets 304 within the cartridge 300 may be replaced without replacing or removing the substrate 302. For example, initially the cartridge 300 may include suitable sputter targets to deposit an anode layer onto the substrate 302. After deposition of the anode layer on the substrate 302, at least one of the sputter targets 304 may then be replaced with a further sputter target comprising material for an electrolyte layer. The cartridge 300 may then be reinserted into the sputter deposition apparatus 126 and the electrolyte layer may be deposited on the anode layer. A similar process may then be performed to deposit a cathode layer on the electrolyte layer, to produce a stack of layers for an energy storage device, such as a solid-state cell. In such cases, the substrate 302 may be transferred from the first reel 308 to the second reel 310 during deposition of the anode layer onto the substrate 302. Subsequently, the conveyance direction D of the substrate 302 may be reversed, and the substrate 302 may be transferred back from the second reel 310 to the first reel 308 during deposition of the electrolyte layer onto the anode layer. The conveyance direction D may be reversed again to transfer the substrate from the first reel 308 to the second reel 310 during deposition of the cathode layer onto the electrolyte layer. This is merely an example, though. In other cases, though, the conveyance direction may remain unchanged. In such cases, the substrate 302 may be transferred from the second reel 310 back to the first reel 308 after the deposition of each layer.

In the example of FIG. 3a, the casing of the cartridge 300 includes a transmissive region 128. However, a similar sputter deposition apparatus to that of FIG. 3a may be used with the cartridges 100, 200 of FIGS. 1 and 2, which include an aperture 122 for entry of the plasma into a deposition zone of the cartridge rather than a transmissive region 128. In such cases, a vacuum may be created in the sputter deposition apparatus 126 during the sputter deposition process, after insertion of the cartridge in the sputter deposition apparatus and before the aperture 122 of the cartridge is opened. After deposition of the target material on the substrate, the aperture 122 of the cartridge may then be closed, and the sputter deposition apparatus may then revert to atmospheric pressure. The cartridge may then be removed from the sputter deposition apparatus. A vacuum may also be created in the sputter deposition apparatus 126 of FIG. 3a when used with the cartridge 300 but need not be, as the plasma 320 is generated in the cartridge 300 rather than outside the cartridge 300.

Figure 3B:
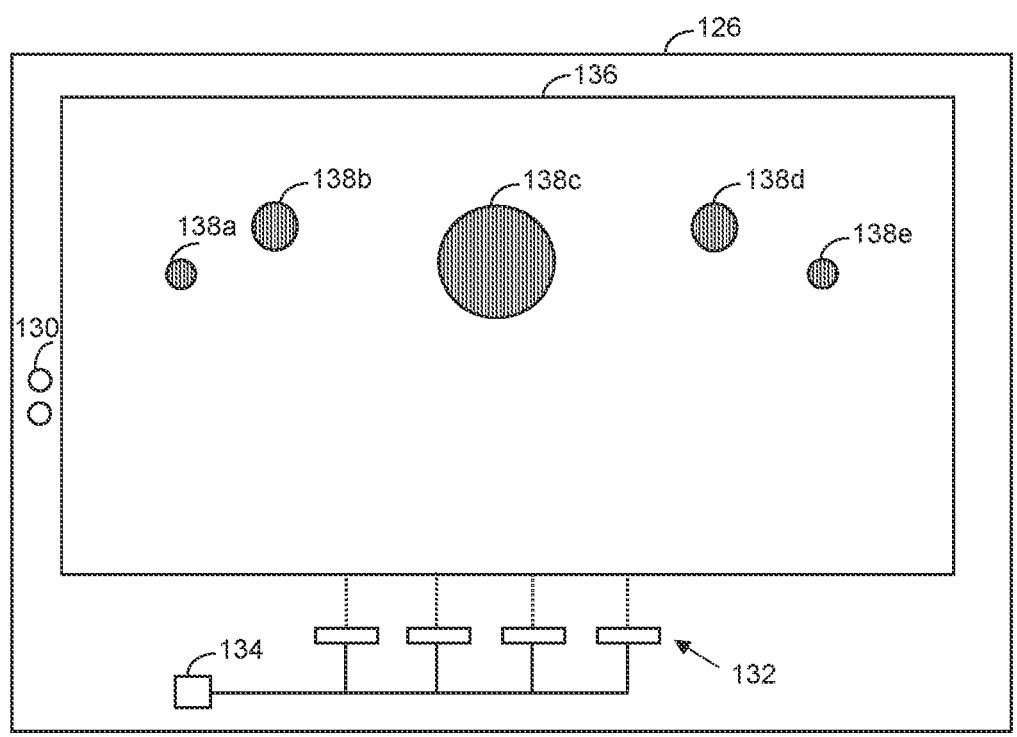
FIG. 3*b* is a schematic diagram of the sputter deposition apparatus according to FIG. 3*a*, without a cartridge inserted therein.

FIG. 3b shows schematically the sputter deposition apparatus 126 of FIG. 3a, without the cartridge inserted. The sputter deposition apparatus 126 includes a cartridge support assembly 136 arranged to support a cartridge, such as the cartridges described above, such that the cartridge is removable from the sputter deposition apparatus 126. For example, the cartridge may comprise a substrate and at least one sputter target for use in sputter deposition of a target material on the substrate. The sputter deposition apparatus 126 further includes the plasma generation arrangement 130 to provide plasma for sputter deposition of the target material onto the substrate.

In the example of FIG. 3b, the sputter deposition apparatus 126 further includes a driving mechanism for driving the conveyor system of the cartridge 300 (once inserted into the sputter deposition apparatus 126), so as to convey the substrate relative to the sputter targets. In this example, the driving mechanism includes driving rollers 138a-138e, which engage with the first reel 108, the first roller 112, the drum 114, the second roller 116 and the second reel 110, respectively, to turn the reels, rollers and drum of the cartridge 300. For example, the driving rollers may have a smaller diameter than the reels, rollers and drum of the cartridge 300, so that the driving rollers fit within and mate with the reels, rollers and drum of the cartridge 300, e.g. via appropriate teeth. One or more of the driving rollers 138a-138e may be spindles, which are for example rods or pins that serve as an axis around which the reels, rollers and/or drum of the cartridge 300 rotate, in use.

Figure 4A:
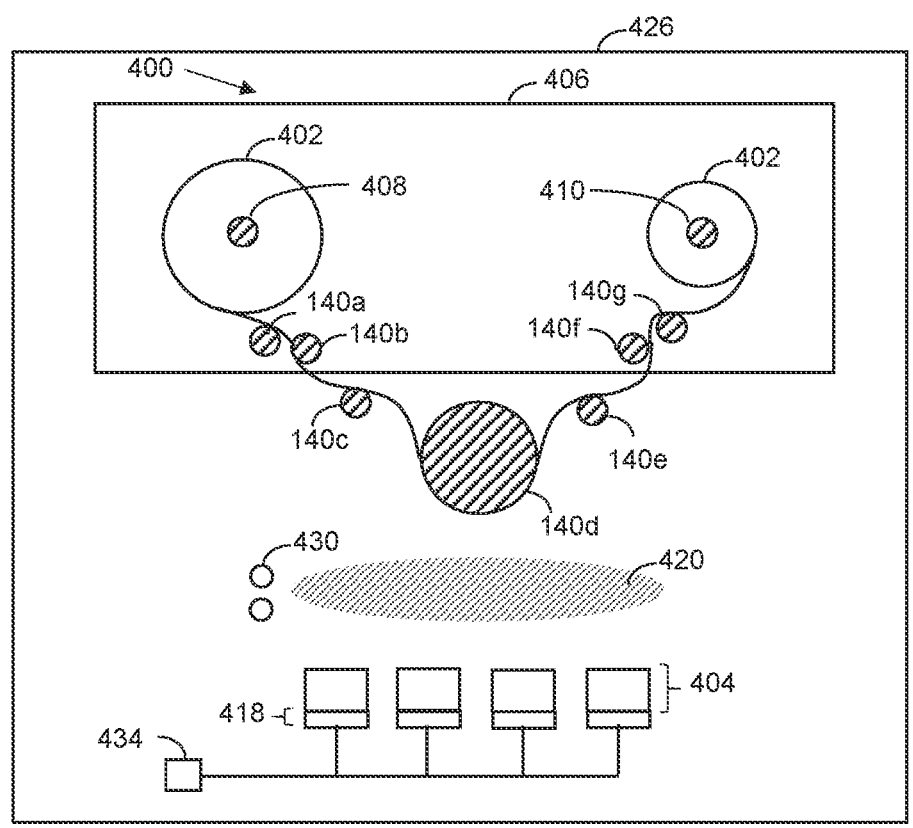
FIG. 4*a* is a schematic diagram of a sputter deposition apparatus according to further examples, with a cartridge inserted therein.
Figure 4B:
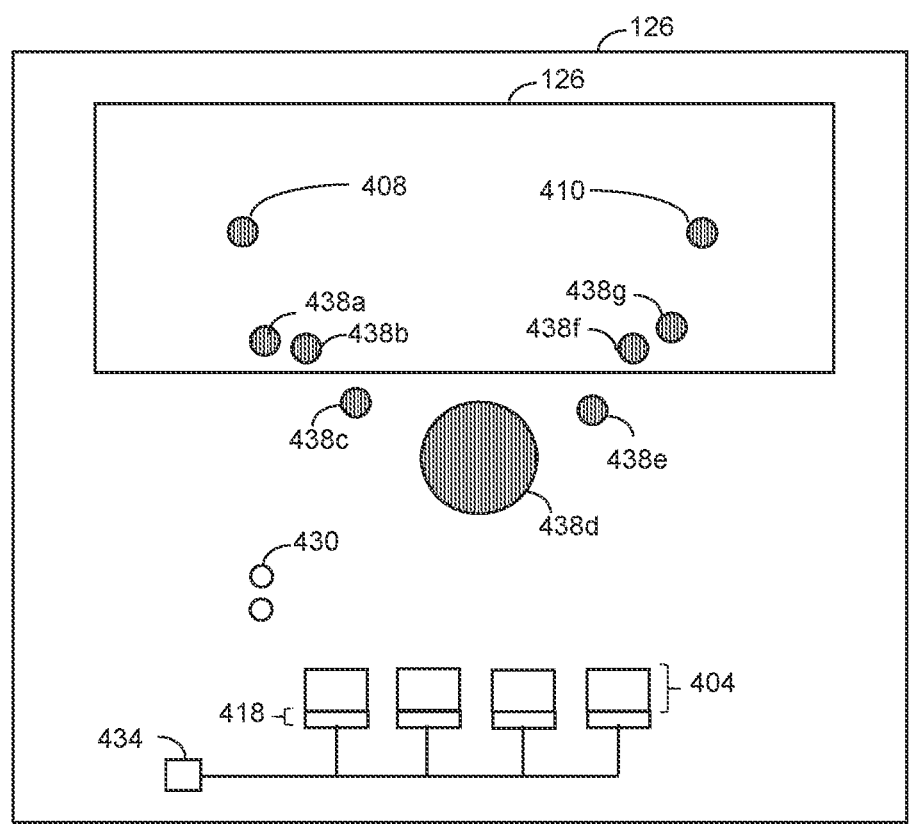
FIG. 4*b* is a schematic diagram of the sputter deposition apparatus according to FIG. 4*a*, without the cartridge inserted therein.

In the sputter deposition apparatus 126 of FIGS. 3a and 3b, sputter deposition occurs within the cartridge 300. FIGS. 4a and 4b are schematic diagrams of a further example of a sputter deposition apparatus 426 in which sputter deposition occurs outside the cartridge, rather than within the cartridge. Features of the sputter deposition apparatus 426 of FIGS. 4a and 4b which are similar to corresponding features of the sputter deposition apparatus 126 of FIGS. 3a and 3b are labelled with the same reference numeral but prefixed by a 4. Corresponding descriptions are to be taken to apply.

The sputter deposition apparatus 426 is shown in FIG. 4a with the cartridge 400 inserted, during sputter deposition. The sputter deposition apparatus 426 is shown in FIGS. 4a and 4b in plan view, whereas FIGS. 3a and 3b illustrate a different sputter deposition apparatus 126 in cross-section.

In FIG. 4a, the cartridge 400 includes the substrate 402 prior to insertion of the cartridge 400 in the sputter deposition apparatus 426. The substrate 402 is gradually unwound from the first reel 408, and from the cartridge 400 and into a deposition zone of the sputter deposition apparatus 426, in which the sputter deposition occurs. In this case, the sputter deposition apparatus 426 includes a plasma generation arrangement 430, which is arranged to provide for sputter deposition of target material including or otherwise derived from material of the sputter targets 404 on at least a portion of the substrate 402 within the deposition zone. The deposition zone is outside the cartridge 400 in this case.

After sputter deposition of the target material on the substrate 402, the substrate 402 is wound back into the cartridge 400 and onto the second reel 410. After processing of the substrate 402, the cartridge 400 may then be sealed, with the processed substrate 402 within. The cartridge 400 may be sealed under vacuum in some cases. The cartridge 400 may then be removed from the sputter deposition apparatus 426.

In examples such as this, the sputter deposition apparatus 426 may be arranged to receive the cartridge 400 with the substrate 402 arranged therein, and may comprise a transport assembly 140 to transport at least the portion of the substrate 402 from the cartridge 400 into the deposition zone, to provide for the sputter deposition within the deposition zone (which in this case is outside of the cartridge 400). The transport assembly 140 is further arranged to transport at least the portion of the substrate 402, after the sputter deposition and with the deposited target material thereon, into the cartridge 400. In the example of FIGS. 4a and 4b, the transport assembly 140 comprises a plurality of rollers 140a-140g (collectively referred to as the transport assembly 140). However, this is merely an example.

The cartridge 400 in these examples may therefore include at least one suitable aperture to allow the substrate 402 to exit the cartridge 400 and to subsequently re-enter the cartridge 400.

FIG. 4b shows the sputter deposition apparatus 426 of FIG. 4a without the cartridge inserted therein. The sputter deposition apparatus 426 of FIG. 4b includes a cartridge support assembly 436 and a driving mechanism 438 for driving the transport assembly 140. The driving mechanism 438 also drives the first and second reels 408, 410 in this case. However, in other cases, the first and/or second reels 408, 410 may be driven separately.

Figure 5:
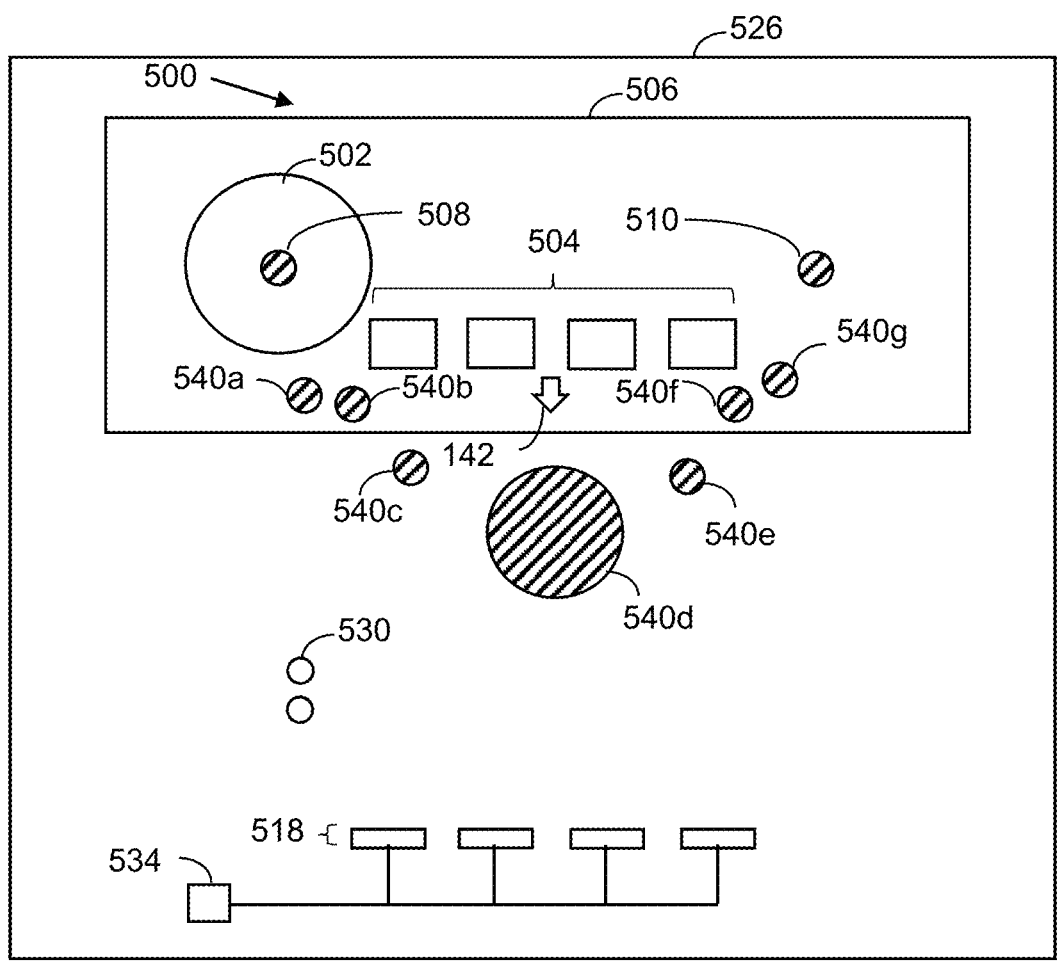
FIG. 5 is a schematic diagram of a sputter deposition apparatus according to yet further examples.

In the example of FIGS. 4a and 4b, the target support assembly 404 and the sputter targets 404 are shown as outside the cartridge 400. The target support assembly 404 and/or the sputter targets 404 may be outside the cartridge 400 even before the cartridge 400 is inserted into the sputter deposition apparatus 426. In other cases, though, the target support assembly 404 and/or the sputter targets 404 may be within the cartridge 400 upon insertion of the cartridge 400 into the sputter deposition apparatus 426. The target support assembly 404 and/or the sputter targets 404 may then be transported from the cartridge 400 and into a different portion of the sputter deposition apparatus 426. FIG. 5 shows schematically such an example. Features of FIG. 5 which are similar to corresponding features of FIG. 4 are labelled with the same reference but prefixed by a 5. Corresponding descriptions are to be taken to apply.

The sputter deposition apparatus 526 of FIG. 5 is shown prior to commencement of sputter deposition. In this example, the sputter deposition apparatus 526 is arranged to receive the cartridge 500 with the at least one sputter target 504 arranged therein. The sputter deposition apparatus 526 further comprises a transport assembly 142 arranged to transport the at least one sputter target 504 from the cartridge 500 into the deposition zone, to provide for the sputter deposition within the deposition zone (which is outside of the cartridge 500). The transport assembly 142 may be a separate assembly than the transport assembly 540 arranged to transport the substrate 502 out of the cartridge 500 or may form part of the same transport assembly. The transport assembly 142 is shown schematically in FIG. 5, but may take any suitable form. For example, the transport assembly 142 may comprise at least one further roller.

In FIG. 5, the at least one sputter target 504 is transported from the cartridge 500 and onto the target support assembly 518. However, in other examples, the cartridge 500 may include both the at least one sputter target 504 and the target support assembly 518. In such cases, the at least one sputter target 504 and the target support assembly 518 may both be transported out of the cartridge 500.

After the at least one sputter target 504 is transported out of the cartridge 500, the sputter deposition apparatus 526 of FIG. 5 is arranged similarly to the sputter deposition apparatus 426 of FIG. 4. Sputter deposition may therefore occur as described in accordance with FIG. 4.

After sputter deposition has ceased, the at least one sputter target 504 and/or the target support assembly 518 may be transported back into the cartridge 500, e.g. by the transport assembly 142, or may remain in the sputter deposition apparatus 526. The cartridge 500 in these examples may therefore include at least one suitable aperture to allow the at least one sputter target 504 and/or the target support assembly 518 to exit the cartridge 500 and to subsequently re-enter the cartridge 500 (if it is desired for the at least one sputter target 504 and/or the target support assembly 518 to re-enter the cartridge 500).

The above examples are to be understood as illustrative examples. Further examples are envisaged. For example, in FIGS. 1 to 3, the cartridge includes the first and second roller and the drum, which together form a conveyor system for conveying the substrate during sputter deposition. However, in other examples, at least part of the conveyor system (and in some cases all of the conveyor system) may be outside the cartridge. For example, the sputter deposition apparatus may include the first and second roller and/or the drum, which may be inserted into the cartridge upon insertion of the cartridge in the sputter deposition apparatus.

In examples above, a chamber of the cartridge may be held under vacuum. In some cases, the cartridge may have a plurality of chambers, at least one of which may be under vacuum, and which may be opened up or otherwise coupled to each other during sputter deposition. For example, the cartridge may have a chamber for containing the sputter targets and at least one further chamber for containing the substrate before and/or after sputter deposition.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the accompanying claims.

The invention claimed is:

1. A sputter deposition apparatus comprising:
a substrate support assembly arranged to support a substrate;
a target support assembly arranged to support at least one sputter target for use in a sputter deposition of a target material onto the substrate;
a plasma generation arrangement arranged to provide plasma for said sputter deposition; and
a cartridge arranged to contain the substrate with deposited target material from the at least one sputter target after said sputter deposition, wherein the cartridge comprises the target support assembly, and the at least one sputter target supported by the target support assembly,
wherein the cartridge is configured as removable from the sputter deposition apparatus, and upon removal the cartridge contains each of the target support assembly, the at least one sputter target supported by the target support assembly, and the substrate with the deposited target material after said sputter deposition.

2. The sputter deposition apparatus according to claim 1, wherein the cartridge comprises a vacuum chamber arranged to contain at least the portion of the substrate with the deposited target material in a vacuum.

3. The sputter deposition apparatus according to claim 1, wherein the plasma generation arrangement is arranged to provide the plasma within a deposition zone of the sputter deposition apparatus, and wherein the cartridge comprises the deposition zone.

4. The sputter deposition apparatus according to claim 3, wherein the plasma generation arrangement is arranged to generate an electric field and/or a magnetic field for generation and propagation of the plasma, and a casing of the cartridge comprises a transmissive region at least partially transmissive for the electric field and/or the magnetic field, to generate the plasma within the deposition zone of the cartridge.

5. The sputter deposition apparatus according to claim 3, wherein the cartridge further comprises the substrate and the substrate support assembly, wherein the cartridge is sealed under vacuum during the sputter deposition.

6. The sputter deposition apparatus according to claim 3, wherein the cartridge comprises an aperture for entry of the plasma into the deposition zone of the cartridge, wherein optionally the aperture is sealable.

7. The sputter deposition apparatus according to claim 1, wherein the plasma generation arrangement is arranged to provide the plasma for the sputter deposition within a deposition zone of the sputter deposition apparatus, wherein the deposition zone is outside the cartridge.

8. The sputter deposition apparatus according to claim 7, wherein the sputter deposition apparatus is arranged to receive the cartridge with the substrate arranged therein, and the sputter deposition apparatus comprises a transport assembly arranged to:
transport at least a portion of the substrate from the cartridge into the deposition zone, to provide for said sputter deposition within the deposition zone; and
transport at least the portion of the substrate, after said sputter deposition, into the cartridge.

9. The sputter deposition apparatus according to claim 8, wherein the sputter deposition apparatus is arranged to receive the cartridge with the at least one sputter target arranged therein, and the transport assembly is further arranged to:
transport the at least one sputter target from the cartridge into the deposition zone, to provide for said sputter deposition within the deposition zone.

10. The sputter deposition apparatus according to claim 1, wherein the substrate support assembly comprises a conveyor system arranged to convey the substrate relative to the at least one sputter target during said sputter deposition.

* * * * *